(12) United States Patent
Nam et al.

(10) Patent No.: US 10,147,776 B2
(45) Date of Patent: Dec. 4, 2018

(54) DISPLAY DEVICE AND METHOD OF MANUFACTURING THE SAME

(71) Applicant: LG Display Co., Ltd., Seoul (KR)

(72) Inventors: Seung-Hee Nam, Paju-si (KR);
Jeong-Oh Kim, Goyang-si (KR);
Jung-Ho Bang, Paju-si (KR);
Jung-Sun Beak, Paju-si (KR);
Jong-Won Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/608,452

(22) Filed: May 30, 2017

(65) Prior Publication Data
US 2017/0345882 A1 Nov. 30, 2017

(30) Foreign Application Priority Data
May 30, 2016 (KR) .................... 10-2016-0066697

(51) Int. Cl.
*H01L 27/32* (2006.01)
*H01L 51/56* (2006.01)

(52) U.S. Cl.
CPC ........ *H01L 27/3248* (2013.01); *H01L 27/322* (2013.01); *H01L 27/3246* (2013.01); *H01L 27/3258* (2013.01); *H01L 27/3262* (2013.01); *H01L 51/56* (2013.01); *H01L 2227/323* (2013.01)

(58) Field of Classification Search
CPC ............. H01L 27/3246; H01L 27/3248; H01L 27/3258; H01L 27/3262
See application file for complete search history.

(56) References Cited

U.S. PATENT DOCUMENTS

| 8,680,517 | B2* | 3/2014 | Shin .................... H01L 27/1255 257/298 |
| 9,219,244 | B2* | 12/2015 | Lee ...................... H01L 51/5203 |
| 9,741,778 | B2* | 8/2017 | You ...................... H01L 27/3258 |
| 2004/0080688 | A1* | 4/2004 | Ishida ............... G02F 1/133555 349/113 |
| 2008/0032431 | A1* | 2/2008 | Hsu ...................... H01L 27/124 438/29 |

(Continued)

FOREIGN PATENT DOCUMENTS

| KR | 2003-0061938 A | 7/2003 |
| KR | 10-2005-0110089 A | 11/2005 |

(Continued)

*Primary Examiner* — Earl Taylor
(74) *Attorney, Agent, or Firm* — Seed Intellectual Property Law Group LLP

(57) ABSTRACT

Disclosed are a display device and a method of manufacturing the same. In the disclosed display device, a pad cover electrode disposed on a pad area comes into contact with an upper surface and a side surface of a pad electrode since a planarization layer is disposed on an active area excluding the pad area, which may prevent contact failure between the pad cover electrode and a conductive ball. In addition, in the display device, a first electrode, which is connected to a thin film transistor via a pixel connection electrode, is formed via the same mask process as the planarization layer so that it has a line width similar to that of the planarization layer and overlaps the planarization layer, which may simplify a structure and a manufacturing process.

18 Claims, 15 Drawing Sheets

(56) References Cited

U.S. PATENT DOCUMENTS

| | | | | |
|---|---|---|---|---|
| 2008/0218091 A1* | 9/2008 | Jo | H01L 27/3276 | 315/169.3 |
| 2011/0079786 A1* | 4/2011 | Kwon | H01L 27/3262 | 257/71 |
| 2011/0309362 A1* | 12/2011 | Yoon | G02F 1/136213 | 257/59 |
| 2012/0286281 A1* | 11/2012 | You | H01L 27/3248 | 257/72 |
| 2013/0056784 A1* | 3/2013 | Lee | H01L 27/3246 | 257/99 |
| 2013/0146878 A1* | 6/2013 | Oh | H01L 51/5265 | 257/59 |
| 2013/0175533 A1* | 7/2013 | Lee | H01L 27/124 | 257/59 |
| 2014/0166996 A1* | 6/2014 | Kim | H01L 51/5203 | 257/40 |
| 2014/0353620 A1* | 12/2014 | Park | H01L 27/3258 | 257/40 |
| 2014/0353622 A1* | 12/2014 | You | H01L 27/3248 | 257/40 |
| 2014/0353631 A1* | 12/2014 | Park | H01L 51/5228 | 257/40 |
| 2014/0353634 A1* | 12/2014 | Lee | H01L 27/3262 | 257/40 |
| 2015/0115256 A1* | 4/2015 | You | H01L 27/3265 | 257/40 |
| 2015/0187854 A1* | 7/2015 | Beak | H01L 27/3262 | 257/40 |
| 2016/0013436 A1* | 1/2016 | Im | H01L 51/5206 | 257/40 |
| 2016/0020422 A1* | 1/2016 | Kim | H01L 51/5228 | 257/40 |
| 2016/0190225 A1* | 6/2016 | Kim | H01L 27/3276 | 257/40 |
| 2016/0240598 A1* | 8/2016 | You | H01L 27/3276 | |
| 2016/0247870 A1* | 8/2016 | Park | H01L 27/3265 | |
| 2016/0351651 A1* | 12/2016 | Jang | H01L 27/3276 | |
| 2016/0351652 A1* | 12/2016 | Kim | H01L 51/0018 | |
| 2016/0351846 A1* | 12/2016 | Kim | H01L 51/5212 | |
| 2016/0351851 A1* | 12/2016 | Lee | H01L 51/5253 | |
| 2017/0062548 A1* | 3/2017 | Han | H01L 27/3276 | |
| 2017/0141176 A1* | 5/2017 | Im | H01L 51/5228 | |
| 2017/0345882 A1* | 11/2017 | Nam | H01L 27/322 | |
| 2017/0358642 A1* | 12/2017 | Jo | H01L 27/3276 | |
| 2018/0006274 A1* | 1/2018 | Kim | G02B 5/3016 | |

FOREIGN PATENT DOCUMENTS

| | | |
|---|---|---|
| KR | 10-2007-0038752 A | 4/2007 |
| KR | 10-2013-0009137 A | 1/2013 |
| KR | 10-2016-0012876 A | 2/2016 |

* cited by examiner

DISPLAY DEVICE AND METHOD OF MANUFACTURING THE SAME

This application claims the benefit of Korean Patent Application No. 10-2016-0066697, filed on May 30, 2016, which is hereby incorporated by reference as if fully set forth herein.

BACKGROUND

Technical Field

The present disclosure relates to a display device and a method of manufacturing the same, and more particularly, to a display device, which may simplify a structure and a manufacturing process thereof and may also prevent contact failure between a pad cover electrode and a conductive ball, and a method of manufacturing the same.

Description of the Related Art

An image display device, which outputs various pieces of information on a screen, is a core technology of the information and communication age, and is being developed in the direction of becoming thinner, lighter, more portable, and having higher performance. Representative examples of such a display device include a liquid crystal display (LCD) device and an organic light-emitting diode (OLED) display device.

In order to manufacture the display device, a mask process using a photo-mask is performed multiple times. Each mask process involves sub-processes such as, for example, cleaning, exposure, developing, and etching. Thus, whenever a single mask process is added, the manufacturing time and manufacturing costs consumed to manufacture the display device are increased and the incidence of failure is increased, causing deterioration in manufacturing yield. Therefore, there is a demand for solutions for reducing the number of mask processes in order to reduce production costs and to increase production yield and production efficiency.

In addition, the display device includes a pad connected to an integrated drive circuit in order to supply a drive signal to each sub-pixel. As illustrated in FIG. 1, the pad includes a pad electrode 2 connected to a signal line of each sub-pixel, and a pad cover electrode 4 connected to a circuit film, on which the integrated drive circuit is mounted, via a conductive ball. The pad cover electrode 4 is connected to the conductive ball through a pad contact hole 10, which penetrates a protective layer 6 and a planarization layer 8 to thereby expose the pad electrode 4. Here, since the planarization layer 8 is formed of an organic insulation material, the pad contact hole 10, which penetrates the planarization layer 8, may be very deep, thus preventing proper contact between the pad cover electrode 4 and the conductive ball. In this case, the drive signal generated in the integrated drive circuit may not be supplied to the signal line of each sub-pixel.

BRIEF SUMMARY

Accordingly, the present disclosure is directed to a display device and a method of manufacturing the same that reduces the limitations and disadvantages of the related art.

One object of the present disclosure is to provide a display device having a simplified structure and a manufacturing process thereof. Such a structure will reduce contact failure between a pad cover electrode and a conductive ball.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, in a display device according to the present disclosure, a pad cover electrode disposed on a pad area comes into contact with an upper surface and a side surface of a pad electrode since a planarization layer is disposed on an active area excluding the pad area, which may prevent contact failure between the pad cover electrode and a conductive ball. In the display device according to the present disclosure, a first electrode, which is connected to a thin film transistor via a pixel connection electrode, is formed via the same mask process as the planarization layer so that it has a line width similar to that of the planarization layer and overlaps the planarization layer, which may simplify a structure and a manufacturing process.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, the embodiments of the present disclosure will be described in detail with reference to the accompanying drawings.

Figure 1:
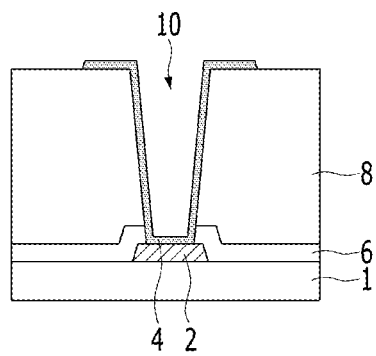
FIG. 1 is a cross-sectional view illustrating a pad electrode and a pad cover electrode of a conventional display device.
Figure 2A:
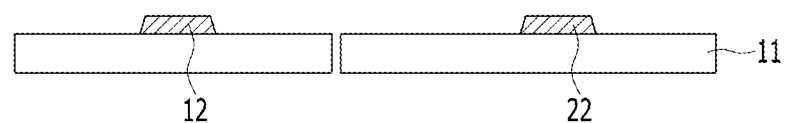
FIGS. 2A to 2C are cross-sectional views for explaining a method of manufacturing a display device according to the present disclosure.
Figure 2B:
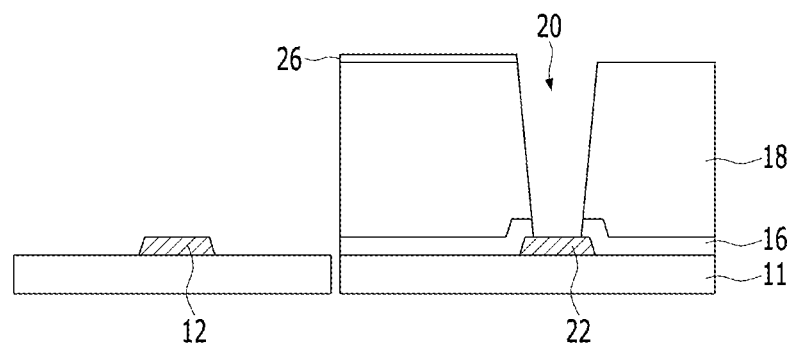
Figure 2C:
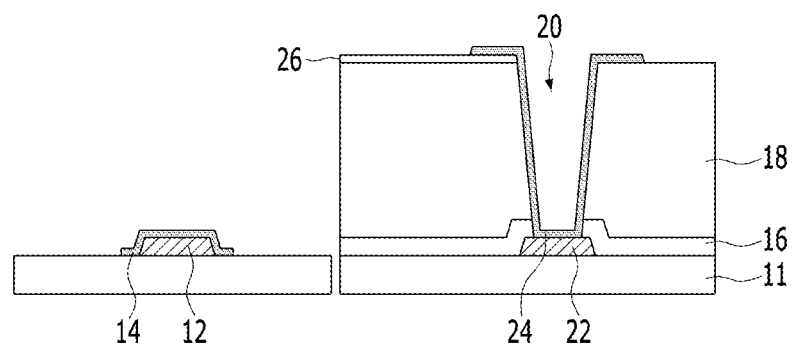

FIGS. 2A to 2C are cross-sectional views for explaining a method of manufacturing a display device according to the present disclosure.

As illustrated in FIG. 2A, a pad electrode 12 is formed on a pad area of a substrate 11, and simultaneously, a drain electrode 22 of a thin film transistor is formed on an active area of the substrate 11. Here, the thin film transistor is connected to each of a gate line and a data line. The pad electrode 12 is connected to any one signal line of the gate line and the data line. Thereby, a drive signal is supplied to the thin film transistor through the signal line connected to the pad electrode 12.

A protective layer 16 formed of an inorganic material, a planarization layer 18 formed of an organic material, and a transparent conductive layer are sequentially formed to cover the pad electrode 12 and the drain electrode 22. Next, as illustrated in FIG. 2B, the protective layer 16 and the planarization layer 18 are formed in the same pattern by patterning the protective layer 16, the planarization layer 18, and the transparent conductive layer at the same time via a mask process using the same mask. Simultaneously, a first electrode 26 (e.g., a pixel electrode of a liquid crystal display device and an anode electrode of an organic light-emitting display device) is formed on the planarization layer 18. Since the protective layer 16 and the planarization layer 18 are disposed only on the active area excluding the pad area, the upper surface and the side surface of the pad electrode 12 are exposed by removing the protective layer 16 and the planarization layer 18 on the pad area. The protective layer 16 and the planarization layer 18 on the active area are formed to have a pixel contact hole 20, which exposes a portion of the upper surface of the drain electrode 22, and the first electrode 26 is formed on the planarization layer 18 to be distinguished for each sub-pixel. The planarization layer 18, disposed underneath the first electrode 26, has a line width similar to that of the first electrode 26 and overlaps the first electrode 26.

Next, as illustrated in FIG. 2C, a pixel connection electrode 24 is formed to electrically connect the first electrode 26 and the drain electrode 22 to each other, and a pad cover electrode 14 is formed to cover the upper surface and the side surface of the pad electrode 12. At this time, the pixel connection electrode 24 comes into contact with the first electrode 26, and also comes into contact with the drain electrode 22 through the pixel contact hole 20, and the pad cover electrode 14 comes into contact with the upper surface and the side surface of the pad electrode 12. The pixel connection electrode 24 and the pad cover electrode 14 are formed of a conductive material having strong corrosion resistance and acid resistance such as indium tin oxide (ITO) or molybdenum (MoTi).

As described above, in the display device according to the present disclosure, the pad cover electrode 14 is directly connected to the upper surface and the side surface of the pad electrode 12 without a pad contact hole. Thereby, the present disclosure may eliminate the problem of an excessive height difference caused by a conventional pad contact hole, which penetrates the protective layer 16 and the planarization layer 18, thereby preventing contact failure between the pad cover electrode 14 and a conductive ball. In addition, in the display device according to the present disclosure, since the first electrode 26, the protective layer 16, and the planarization layer 18 are formed via the same single mask process, the planarization layer 18 and the protective layer 16, which overlap the first electrode 26, are disposed underneath the first electrode 26 and have a line width similar to that of the first electrode 26. In addition, in the display device according to the present disclosure, the pixel connection electrode 24 and the pad cover electrode 14 are formed via the same single mask process. Thereby, the present disclosure may reduce the total number of mask processes by one compared to the related art, which may increase productivity and reduced costs.

Figure 3:
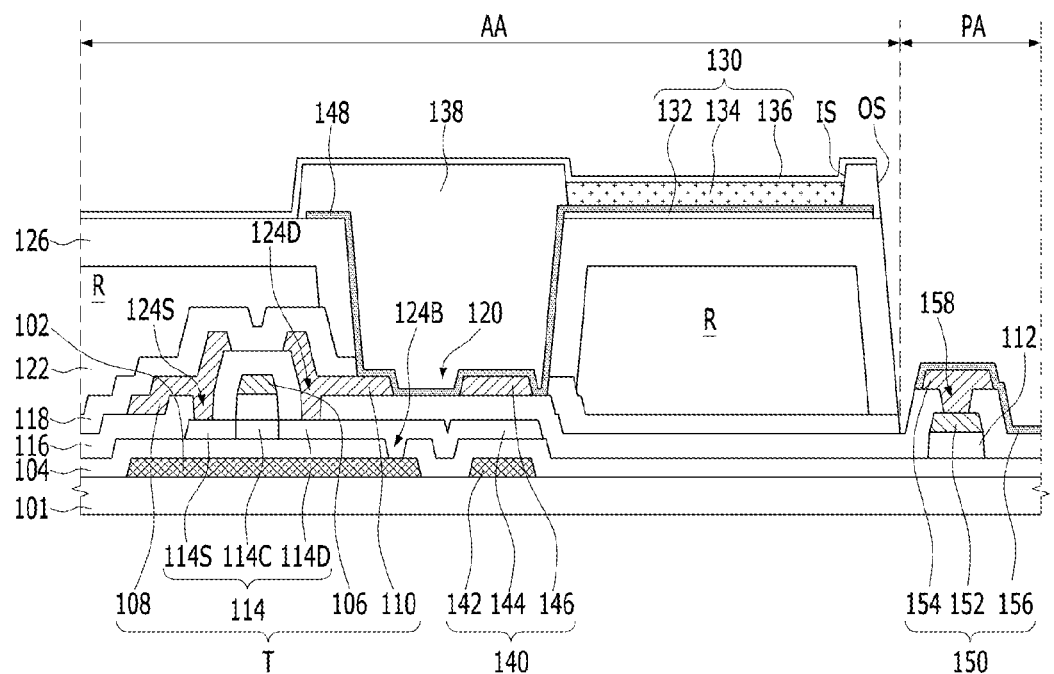
FIG. 3 is a cross-sectional view of an organic light-emitting display device according to a first embodiment of the present disclosure.

FIG. 3 is a cross-sectional view of an organic light-emitting display device according to a first embodiment of the present disclosure, to which the manufacturing method of FIGS. 2A to 2C is applied.

As illustrated in FIG. 3, the organic light-emitting display device according to the first embodiment of the present disclosure includes an active area AA and a pad area PA. The active area AA will contain a large number of pixels and be relatively large so as to cover most of the device. The pad area PA is usually spaced some distance from the individual pixels; they are not usually directly abutting each other and relative locations in FIG. 3 are not to scale in their distance from each other, the vertical dotted line representing some separation distance.

On the pad area PA of a substrate 101, a plurality of pads 150 is formed to supply a drive signal to each of a gate line, a data line, and a power line, which are located on the active area AA. Each of the pads 150 includes a first pad electrode 152, a second pad electrode 154, and a pad cover electrode 156.

The first pad electrode 152 is formed on a gate insulation pattern 112, which has the same shape as the first pad electrode 152, using the same material as a gate electrode 106.

The second pad electrode 154 is electrically connected to the first pad electrode 152, which is exposed through a pad contact hole 158, which penetrates an interlayer insulation layer 116. The second pad electrode 154 is formed on the interlayer insulation layer 116, which is the same layer as source and drain electrodes 108 and 110, using the same material as the source and drain electrodes 108 and 110.

The pad cover electrode 156 is formed of, for example, indium tin oxide (ITO), indium zinc oxide (IZO) or indium tin zinc oxide (ITZO), which has strong corrosion resistance and acid resistance, and comes into contact with the second pad electrode 154. The pad cover electrode 156 is formed to cover the upper surface and the side surface of the second pad electrode 154, thereby completely sealing the second pad electrode 154. Thereby, the pad cover electrode 156 may prevent the second pad electrode 154 from being damaged by, for example, an etching solution that is used to form a cathode electrode 136, or may prevent the second pad electrode 154 from being exposed to, for example external moisture, and being oxidized. On the active area AA, a plurality of sub-pixels is arranged in a matrix form. Each sub-pixel is provided with a light-shielding layer 102, a thin film transistor T, a storage capacitor 140, a bank 138, a pixel connection electrode 148, and an organic light-emitting diode (OLED).

The thin film transistor T includes the gate electrode 106, the source electrode 108, the drain electrode 110, and an active layer 114.

The gate electrode 106 is formed on the gate insulation pattern 112, which has the same pattern as the gate electrode 106. The gate electrode 106 overlaps a channel area 114c of the active layer 114 with the gate insulation pattern 112 interposed therebetween. The gate electrode 106 may be formed in a single layer or multiple layers using any one of molybdenum (Mo), aluminum (Al), chrome (Cr), gold (Au), titanium (Ti), nickel (Ni), neodymium (Nd) and copper (Cu) and an alloy thereof, without being limited thereto.

The source electrode 108 is connected to a source area 114S of the active layer through a source contact hole 124S, which penetrates the interlayer insulation layer 116. The drain electrode 110 is connected to a drain area 114D of the active layer through a drain contact hole 124D, which penetrates the interlayer insulation layer 116. In addition, the drain electrode 110 is connected to an anode electrode 132 through the pixel contact hole 120, which penetrates a protective layer 118 and a planarization layer 126.

For example, the source electrode 108 and the drain electrode 110 may be formed in a single layer or multiple layers using any one of molybdenum (Mo), aluminum (Al), chrome (Cr), gold (Au), titanium (Ti), nickel (Ni), neodymium (Nd) and copper (Cu) and an alloy thereof, without being limited thereto.

The active layer 114 includes the source area 114S and the drain area 114D, which face each other with the channel area 114C interposed therebetween. The channel area 114C overlaps the gate electrode 106 with the gate insulation pattern 112 interposed therebetween. The source area 114S is connected to the source electrode 108 through the source contact hole 124s, and the drain area 114D is connected to the drain electrode 110 through the drain contact hole 124D. Each of the source area 114S and the drain area 114D is formed of a semiconductor material having an n-type or p-type dopant therein, and the channel area 114C is formed of a semiconductor material having no n-type or p-type dopant therein.

A buffer layer 104 and the light-shielding layer 102 are formed between the active layer 114 and the substrate 101. The light-shielding layer 102 is formed on the substrate 101 to overlap the channel area 114C of the active layer. The light-shielding layer 102 may absorb or reflect external light introduced thereinto, and thus, may minimize the amount of light to be introduced into the channel area 114C. Here, the light-shielding layer 102 may be exposed through a buffer contact hole 124B, which penetrates the buffer layer 104, to be electrically connected to the active layer 114. The light-shielding layer 102 is formed of an opaque metal such as Mo, Ti, Al, Cu, Cr, Co, W, Ta or Ni.

The buffer layer 104 is formed in a single layer or in double layers using an oxide silicon or a nitride silicon on the substrate 101, which is formed of glass or a plastic resin such as, for example, polyimide (PI). The buffer layer 104 serves to prevent the diffusion of moisture or foreign substances in the substrate 101 or to adjust the transfer rate of heat upon crystallization, thereby facilitating the crystallization of the active layer 114.

The storage capacitor 140 includes first and second storage capacitors. The first storage capacitor includes a storage lower electrode 142 and a storage intermediate electrode 144, which overlap each other with the buffer layer 104 interposed therebetween, and the second storage capacitor includes the storage intermediate electrode 144 and a storage upper electrode 146, which overlap each other with the interlayer insulation layer 116 interposed therebetween. Here, the storage lower electrode 142 is formed on the same layer as the light-shielding layer using the same material as the light-shielding layer, and the storage intermediate electrode 144 is formed on the same layer as the active layer 114 using the same material as the active layer 114. The storage upper electrode 146 is formed on the same layer as the source electrode 108 using the same material as the source electrode 108.

A color filter 122 is disposed on the protective layer 118 to cover the storage capacitor 140 and the thin film transistor T. Any one of red, (R) green (G) and blue (B) color filters 122 is disposed on each sub-pixel, and these color filters may be alternately arranged. In addition to the red, green and blue color filters 122, a white color filter 122 may be further provided. In this case, the color filters 122 are formed in a single layer or in multiple layers (e.g., red and/or green color filters 122) and may extend to the areas on which the thin film transistors T are formed to cover the thin film transistors T. The planarization layer 126 is formed on the substrate 101 having the color filters 122 using an organic insulation material such as, for example, photo acryl for the planarization of the substrate 101. The planarization layer 126 is formed on the active area AA excluding the pad area, and the protective layer 118, formed of an inorganic insulation material, is disposed underneath the planarization layer 126 and has a line width similar to that of the planarization layer 126 to overlap the planarization layer 126. The planarization layer 126 and the protective layer 118 formed on the active area have the pixel contact hole 120, which exposes the drain electrode 110.

The light-emitting element 130 includes the anode electrode 132 connected to the drain electrode 110 of the thin film transistor T, the organic light-emitting layer 134 formed on the anode electrode 132, and the cathode electrode 136 formed on the organic light-emitting layer 134.

The anode electrode 132 is disposed on the planarization layer 126 to overlap the emission area defined by the bank 138. The anode electrode 132 is electrically connected to the drain electrode 110 via the pixel connection electrode 148. Here, the pixel connection electrode 148 comes into contact with the drain electrode 110 through the pixel contact hole 120, which penetrates the protective layer 118 and the planarization layer 126. In addition, the pixel connection electrode 148 comes into contact with the anode electrode 132 without a separate contact hole. Meanwhile, since the pixel connection electrode 148 is disposed to cover the anode electrode 132 on the emission area in which the light-emitting layer 134 is disposed, the pixel connection electrode 148 is formed of the same transparent conductive layer as the anode electrode 132. For example, the pixel connection electrode 148 and the anode electrode 132 are formed of a transparent conductive layer such as indium tin oxide (ITO) or indium zinc oxide (IZO).

The organic light-emitting layer 134 is formed on the anode electrode 132 in the emission area defined by the bank 138. The organic light-emitting layer 134 includes a hole layer, an emission layer, and an electron layer, which are stacked one above another on the anode electrode 132 in this order or in the reverse order.

The bank 138 has an inner side surface IS in contact with the organic light-emitting layer 134, and an outer side surface OS disposed along the side surface of the anode electrode 132 to cover the side surface of the anode electrode 132. Thereby, the bank 138 is formed along the rim of the anode electrode 132, excluding the emission area, to cover the side surface of the anode electrode 132, thus taking the form of an island that opens the emission area. The bank 138 may be formed of an opaque material (e.g., a black material) in order to prevent light interference between neighboring sub-pixels. In this case, the bank 138 is formed of a light-shielding material including at least one of a colored pigment and organic carbon black.

The cathode electrode 136 is formed on the upper surface and the side surface of the organic light-emitting layer 134 and the bank 138 to be opposite the anode electrode 132 with the organic light-emitting layer 134 interposed therebetween.

Meanwhile, in a bottom-emission-type organic light-emitting display device, the cathode electrode 136 includes a metal material having high reflection efficiency. For example, the cathode electrode 136 takes the form of a stack including a transparent conductive layer formed of indium tin oxide (ITO) or indium zinc oxide (IZO) and a metal layer formed of, for example, aluminum (Al), silver (Ag), or APC (Ag;Pb;Cu). On the other hand, in a top-emission-type organic light-emitting display device, the anode electrode 132 is formed of a transparent conductive oxide (TCO) layer.

FIGS. 4A to 4J are cross-sectional views for explaining a method of manufacturing the organic light-emitting display device illustrated in FIG. 3.

Figure 4A:
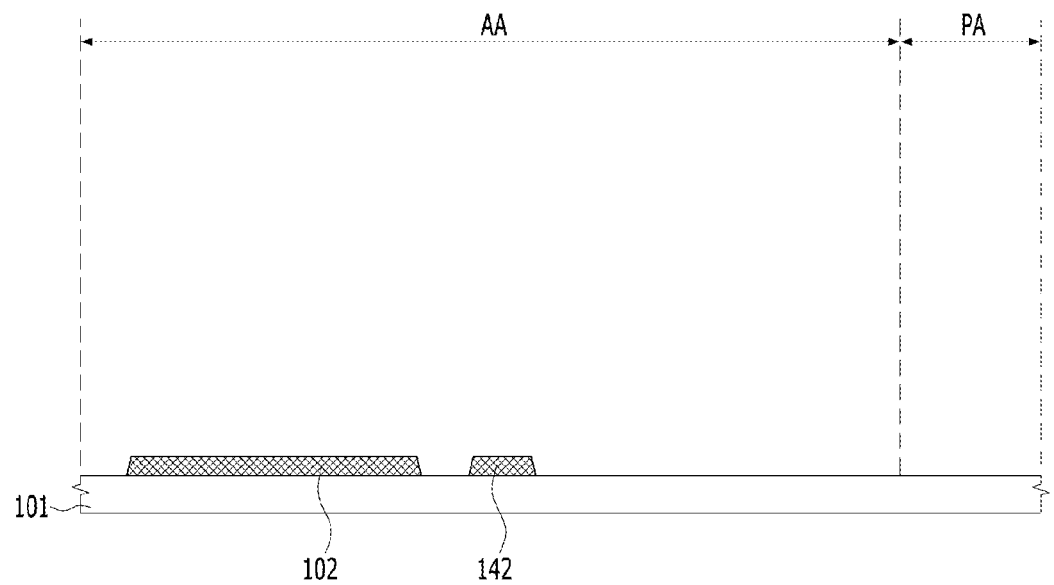
FIGS. 4A to 4J are cross-sectional views for explaining a method of manufacturing the organic light-emitting display device illustrated in FIG. 3.

As illustrated in FIG. 4A, the light-shielding layer 102 and the storage lower electrode 142 are formed on the substrate 101.

Specifically, an opaque metal layer is formed on the substrate 101 via a deposition process. Next, the light-shielding layer 102 and the storage lower electrode 142 are formed by patterning the opaque metal layer via a photolithography process and an etching process.

Figure 4B:
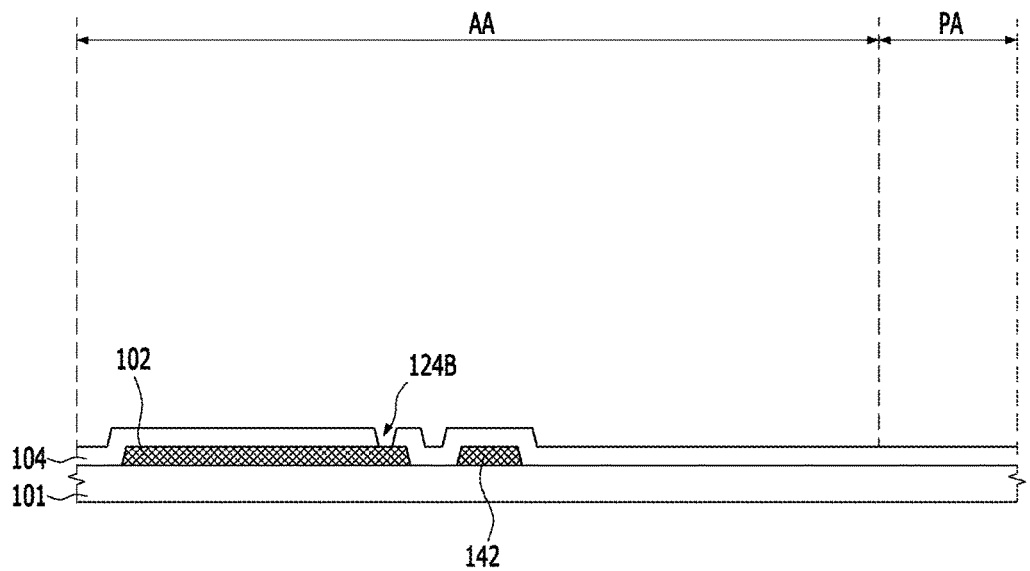

Referring to FIG. 4B, the buffer layer 104 having the buffer contact hole 124B is formed on the substrate 101 having the light-shielding layer 102 and the storage lower electrode 142 formed thereon.

Specifically, the buffer layer 104 is formed via the deposition process by which the light-shielding layer 102 is formed. Next, the buffer contact hole 124B is formed by patterning the opaque metal layer via a photolithography process and an etching process. Here, the buffer contact hole 124B penetrates the buffer layer 104 to expose the light-shielding layer 102.

Figure 4C:
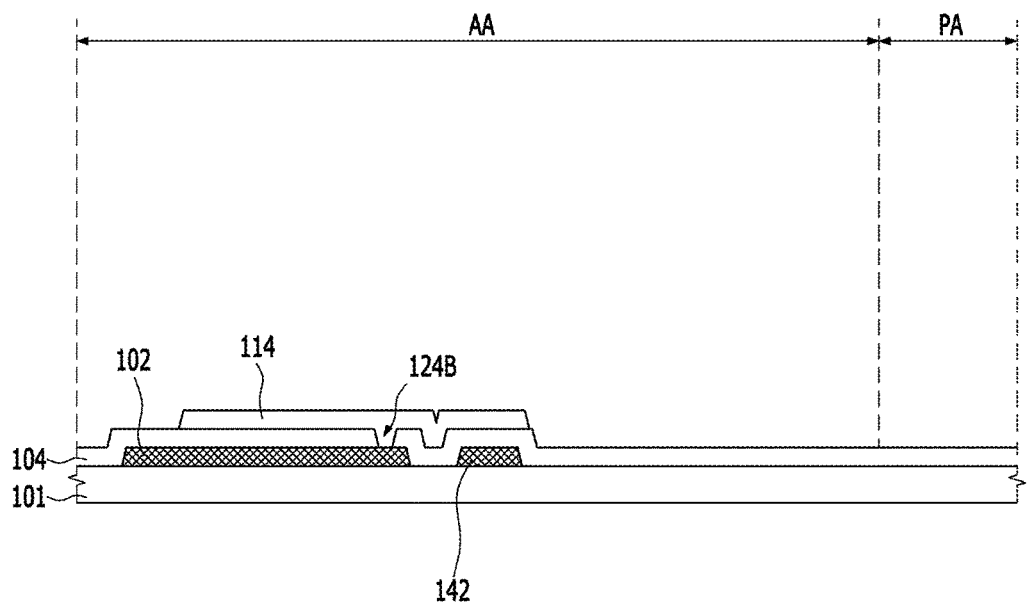

Referring to FIG. 4C, the active layer 114 is formed on the substrate 101 having the buffer layer 104 formed thereon.

Specifically, a thin amorphous silicon layer is formed via, for example, low pressure chemical vapor deposition (LP-CVD) or plasma enhanced chemical vapor deposition (PECVD) on the substrate 101 having the buffer layer 104 formed thereon. Next, the thin amorphous silicon layer is formed into a thin polysilicon layer via crystallization. Then, the active layer 114 is formed by patterning the thin polysilicon layer via a photolithography process and an etching process.

Figure 4D:
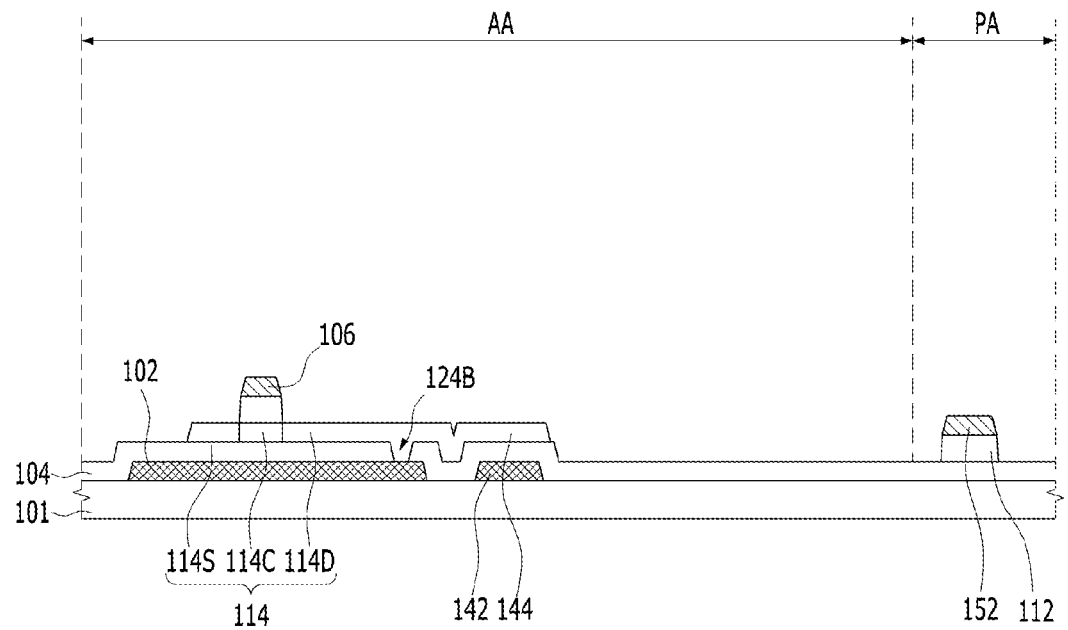

Referring to FIG. 4D, the gate electrode 106, each first pad electrode 152, and the gate insulation pattern 112 are formed in the same pattern on the buffer layer 104 having the active layer 114 formed thereon.

Specifically, a gate insulation layer is formed on the buffer layer 104 having the active layer 114 formed thereon, and a gate metal layer is formed thereon via deposition such as, for example, sputtering. The gate insulation layer is formed of an inorganic insulation material such as SiOx or SiNx. The gate metal layer may be formed in a single layer using a metal material such as Mo, Ti, Cu, AlNd, Al, Cr or an alloy thereof, or may be formed in multiple layers using the same. Next, the gate electrode 106, each first pad electrode 152, and the gate insulation pattern 112 are formed in the same pattern by patterning the gate metal layer and the gate insulation layer at the same time via a photolithography process and an etching process.

Next, the source area 114S and the drain area 114D of the active layer 114 and the storage intermediate electrode 144 are formed by introducing an n+ or p+ dopant into the active layer 114 using the gate electrode 106 as a mask.

Figure 4E:
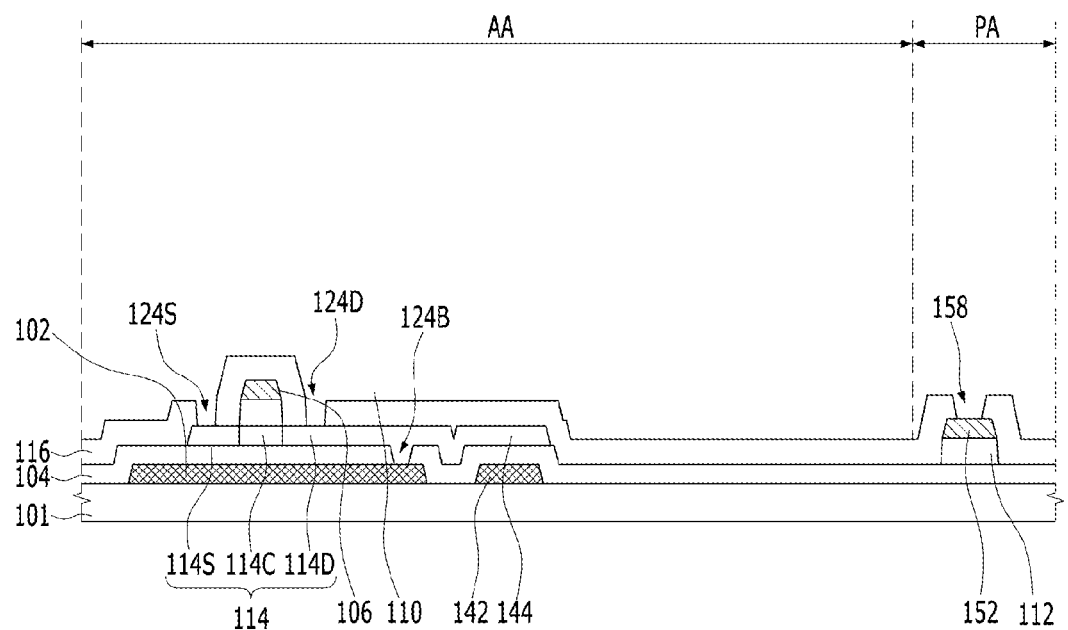

Referring to FIG. 4E, the interlayer insulation layer 116, which has the source and drain contact holes 124S and 124D and the pad contact hole 158, is formed on the substrate 101 having the gate electrode 106, the storage intermediate electrode 144, and the first pad electrode 152 formed thereon.

Specifically, the interlayer insulation layer 116 is formed via deposition such as, for example, PECVD on the substrate 101 having the gate electrode 106, the storage intermediate electrode 144, and the first pad electrode 152 formed thereon. Next, the source and drain contact holes 124S and 124D and the pad contact hole 158 are formed by patterning the interlayer insulation layer 116 via a photolithography process and an etching process.

Figure 4F:
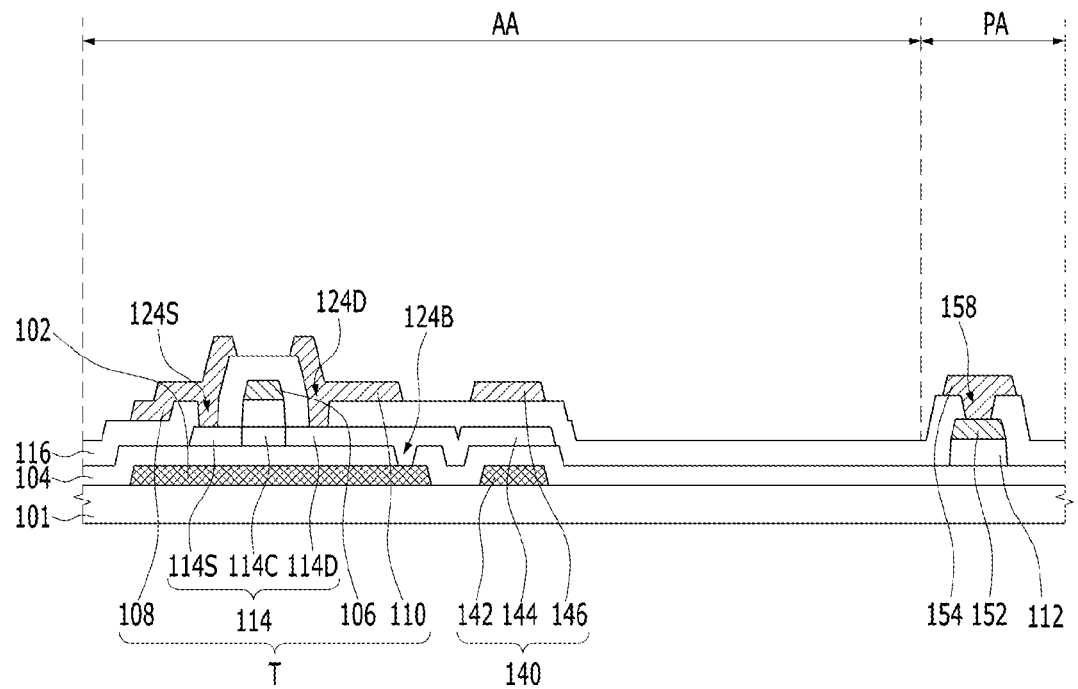

Referring to FIG. 4F, the source electrode 108, the drain electrode 110, the storage upper electrode 146, and the second pad electrode 154 are formed on the interlayer insulation layer 116 having the source and drain contact holes 124S and 124D and the pad contact hole 158.

Specifically, a data metal layer is formed via deposition such as, for example, sputtering on the interlayer insulation layer 116 having the source and drain contact holes 124S and 124D and the pad contact hole 158. The data metal layer may be formed in a single layer using a metal material such as Mo, Ti, Cu, AlNd, Al, Cr or an alloy thereof, or may be formed in multiple layers using the same. Next, the source electrode 108, the drain electrode 110, the storage upper electrode 146, and the second pad electrode 154 are formed on the interlayer insulation layer 116 by patterning the data metal layer via a photolithography process and an etching process.

Figure 4G:
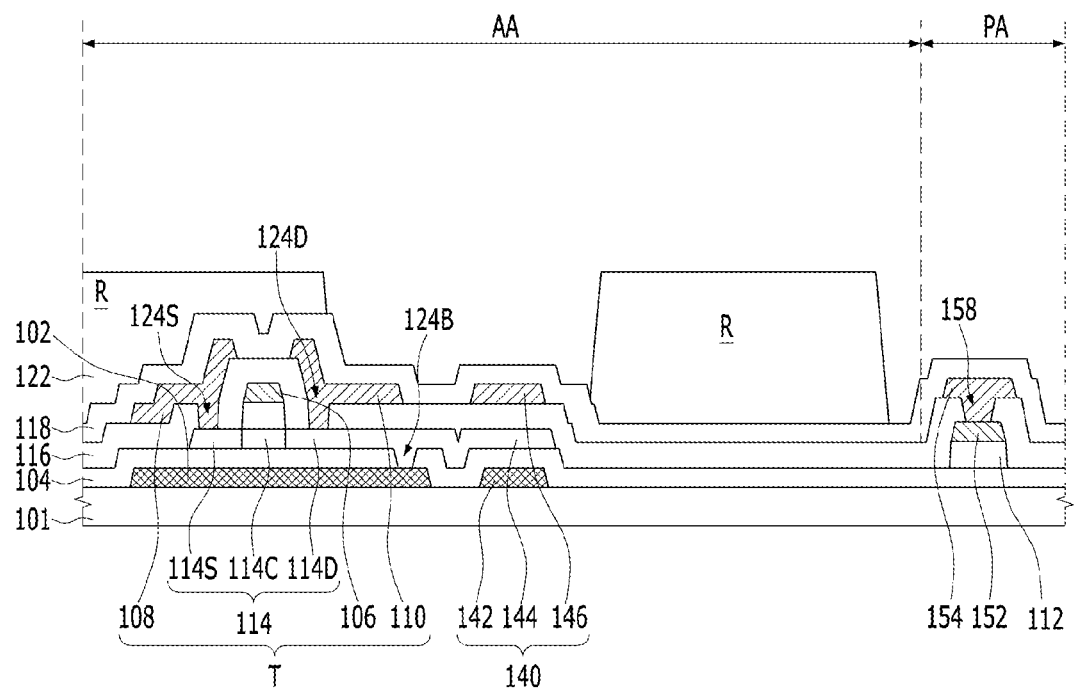

Referring to FIG. 4G, the protective layer 118 and the red, green and blue color filters 122 are sequentially formed on the interlayer insulation layer 116 having the source electrode 108, the drain electrode 110, the storage upper electrode 146, and the second pad electrode 154 formed thereon. The red color filter has the letter R therein. The green one the letter G a blue filter the letter B, but the green and blue are not shown in this section of the AA.

Specifically, the protective layer 118 is formed on the interlayer insulation layer 116 having the source electrode 108, the drain electrode 110, the storage upper electrode 146, and the second pad electrode 154 formed thereon. The protective layer 118 is formed of an inorganic insulation material such as, for example, SiOx or SiNx. Next, the red color filter 122 is formed by applying a red color layer to the entire surface of the protective layer 118, and then patterning the red color layer via a photolithography process. Next, the green color filter 122 is formed by applying a green color layer to the entire surface of the substrate 101 having the red color filter 122 formed thereon, and then patterning the green color layer via a photolithography process. Next, the blue color filter 122 is formed by applying a blue color layer to the entire surface of the substrate 101 having the green color filter 122 formed thereon and then patterning the blue color layer via a photolithograph process. At this time, each of the red, green and blue color filters 122 may be formed not only on the emission area, but also on the area in which the thin film transistor T is formed.

Figure 4H:
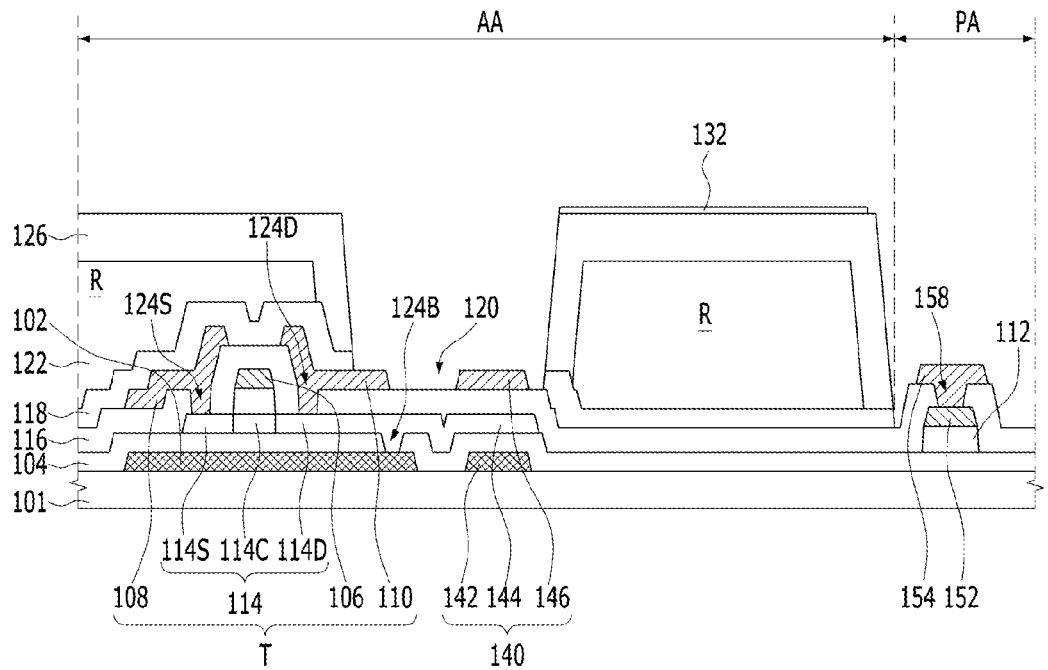

Referring to FIG. 4H, the pixel contact hole 120, the planarization layer 126, and the anode electrode 132 are formed via the same mask process on the substrate 101 having the color filters 122 formed thereon. A detailed description thereof will follow with reference to FIGS. 5A to 5C.

Figure 5A:
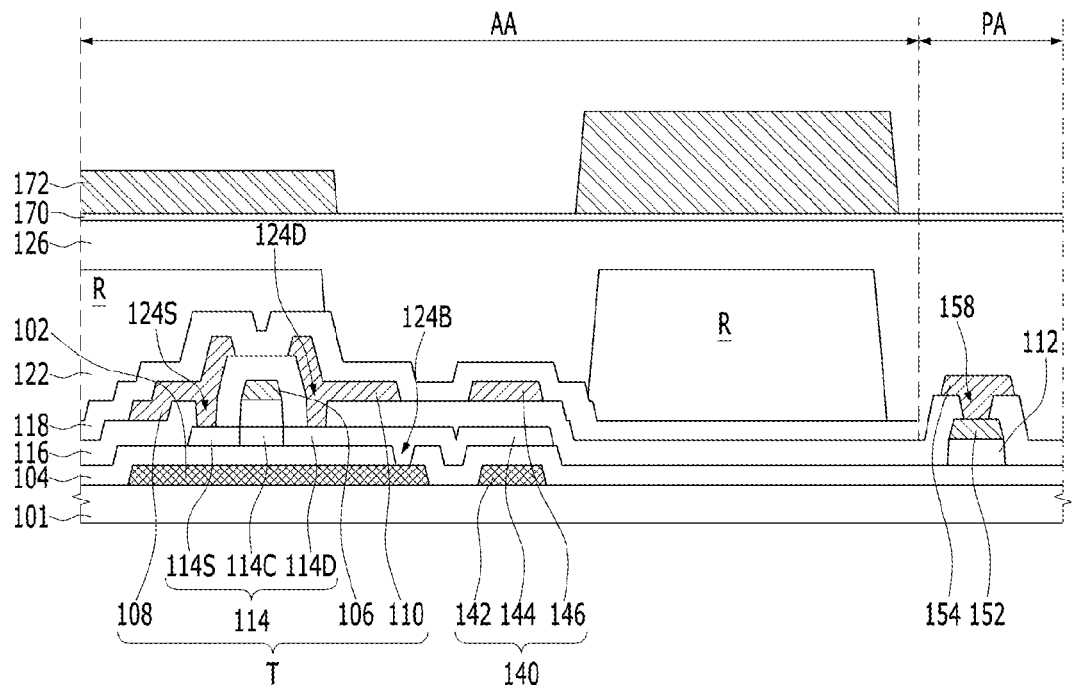
FIGS. 5A to 5C are cross-sectional views for explaining a method of manufacturing a pixel contact hole, a planarization layer, and an anode electrode illustrated in FIG. 4H in detail.
Figure 5B:
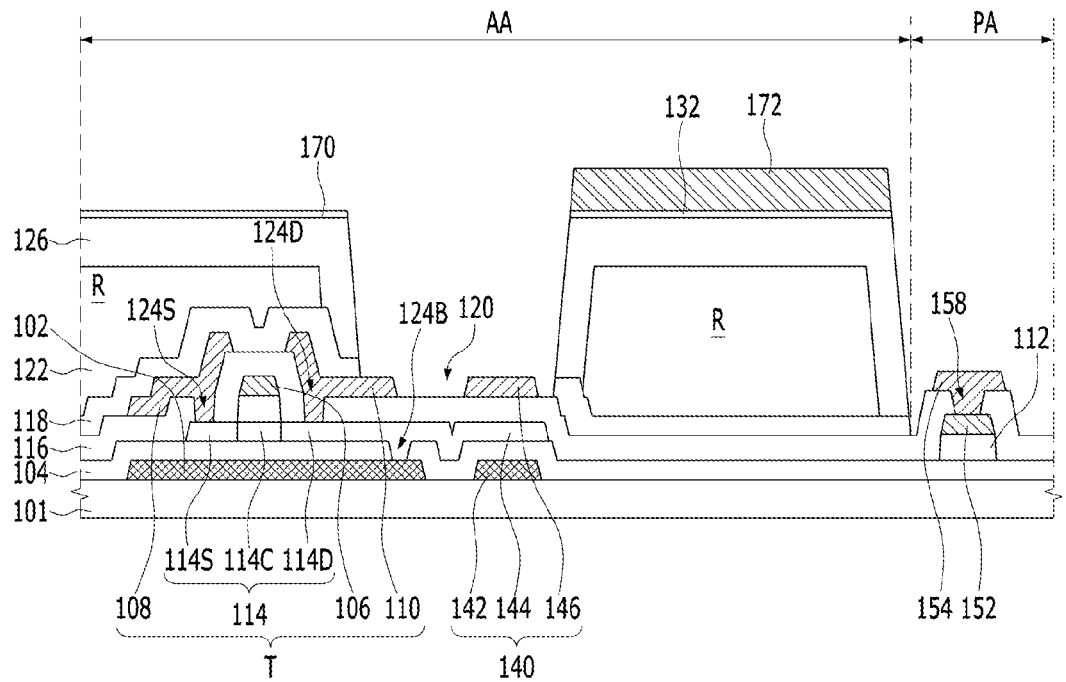
Figure 5C:
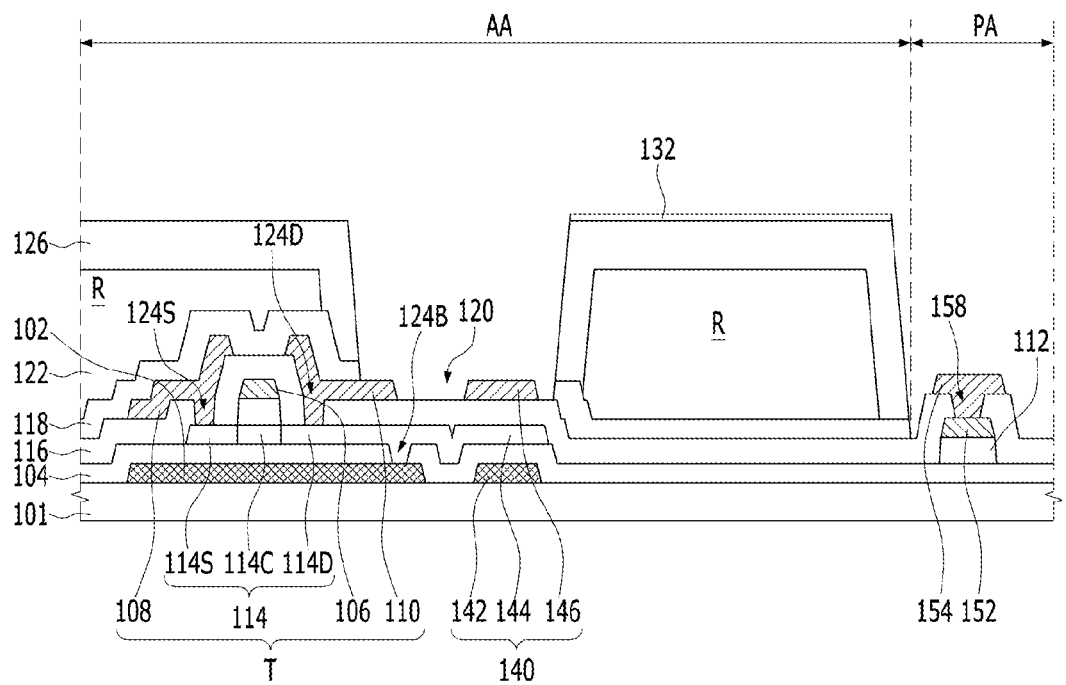

As illustrated in FIG. 5A, the planarization layer 126 formed of an acryl resin and the first transparent conductive layer 170 are sequentially stacked one above another on the substrate 101 having the color filters 122 formed thereon. Next, an anode photosensitive pattern 172 is formed by applying an anode photosensitive layer to the entire surface of the first transparent conductive layer 170 and then patterning the anode photosensitive layer via exposure and developing processes using a halftone mask or a slit mask. The anode photosensitive pattern 172 is formed into a first thickness on the area in which the anode photosensitive pattern overlaps the thin film transistor T, and is also formed into a second thickness on the area in which the anode photosensitive pattern overlaps the emission area. As illustrated in FIG. 5B, the anode electrode 132 is formed on the emission area by primarily wet etching the first transparent conductive layer 170 using the anode photosensitive pattern 172 as a mask. Next, the pixel contact hole 120 is formed to expose the drain electrode 110 and the storage upper electrode 146 by dry etching the planarization layer 126 and the protective layer 118 using the anode photosensitive pattern 172 as a mask. Then, the second pad electrode 154 is exposed by removing the planarization layer 126 and the protective layer 118 on the pad area PA. By ashing the anode photosensitive pattern 172 with an etching gas used during the dry etching, the anode photosensitive pattern 172 having the first thickness is removed and the anode photosensitive pattern 172 having the second thickness is reduced in thickness. The transparent conductive layer 170 remaining on the area in which the transparent conductive layer overlaps the thin film transistor T is removed via secondary wet etching using the anode photosensitive pattern 172 having the reduced thickness as a mask, as illustrated in FIG. 5C.

As described above, the planarization layer 126 and the protective layer 118 of the present disclosure are patterned via the dry etching process using the anode photosensitive pattern 172, which is used to form the anode electrode 132, whereby the planarization layer 126 of the present disclosure may be formed of a thermosetting material, which has higher transmittance than an optically curable material. On the other hand, since a conventional planarization layer needs to be used as a mask pattern when patterning a protective layer disposed underneath thereof, it is formed of an optically curable material including a photoinitiator, which reacts to an exposure process. Accordingly, the conventional planarization layer formed of an optically curable material has relatively low transmittance, whereas the planarization layer 126 of the present disclosure is formed of a thermosetting material and has higher transmittance compared to the related art.

Figure 4I:
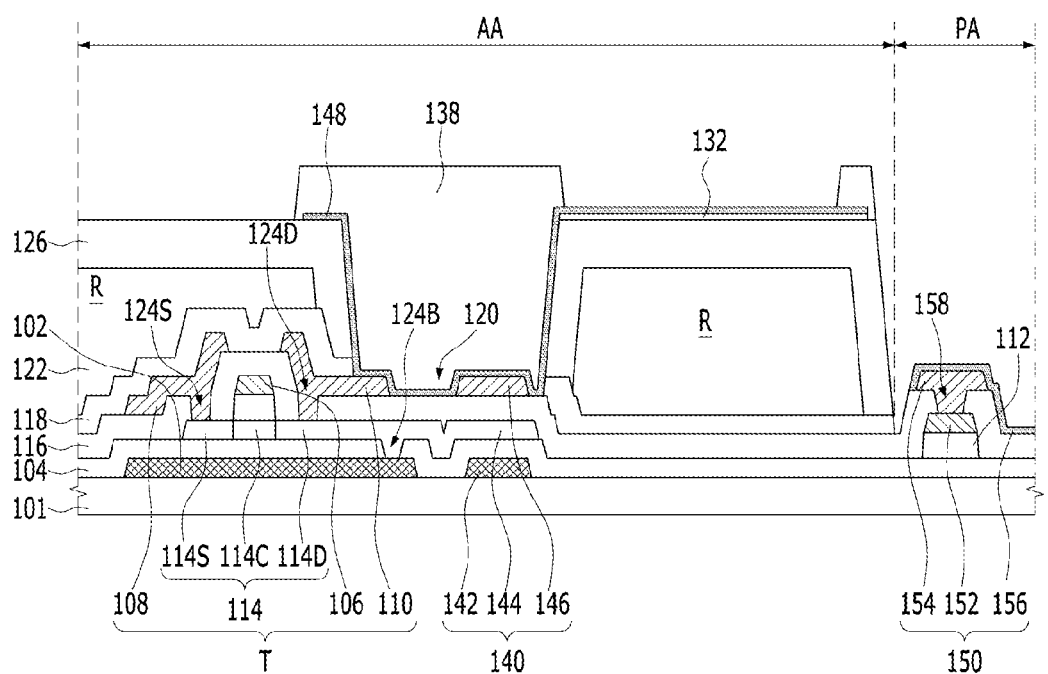

Referring to FIG. 4I, the bank 138, the pixel connection electrode 148, and the pad cover electrode 156 are formed at the same time, in the same metal deposition and formation steps on the substrate 101 having the planarization layer 126 and the anode electrode 132. A detailed description thereof will follow with reference to FIGS. 6A to 6C.

Figure 6A:
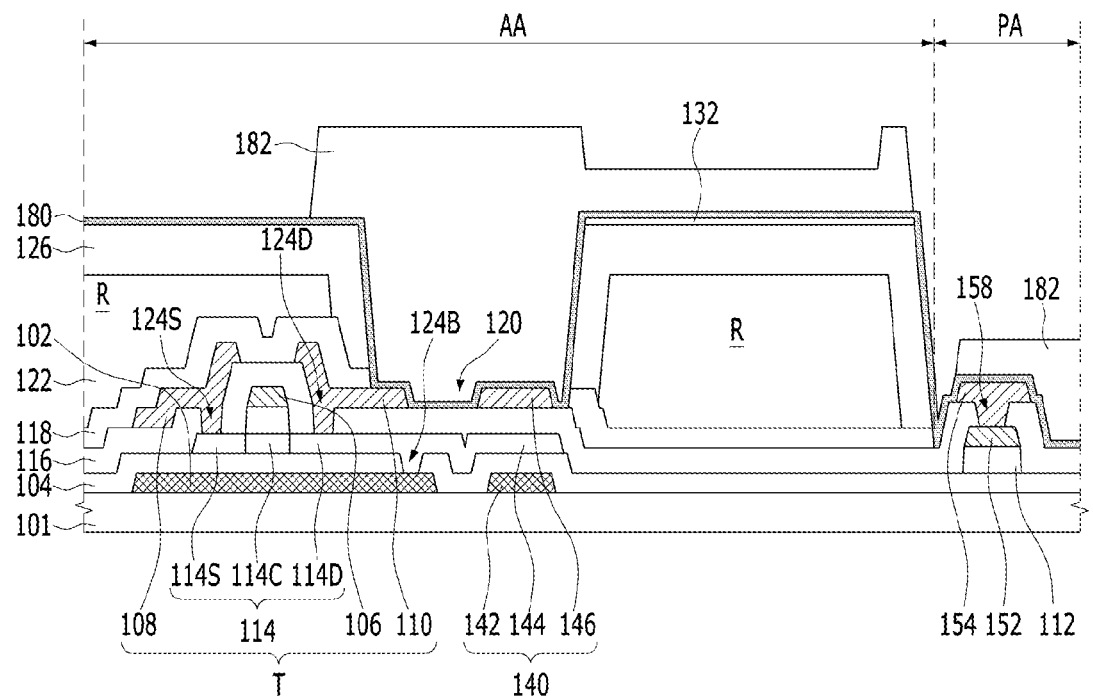
FIGS. 6A to 6C are cross-sectional views for explaining a method of manufacturing a bank, a pixel connection electrode, and a pad cover electrode illustrated in FIG. 4I in detail.
Figure 6B:
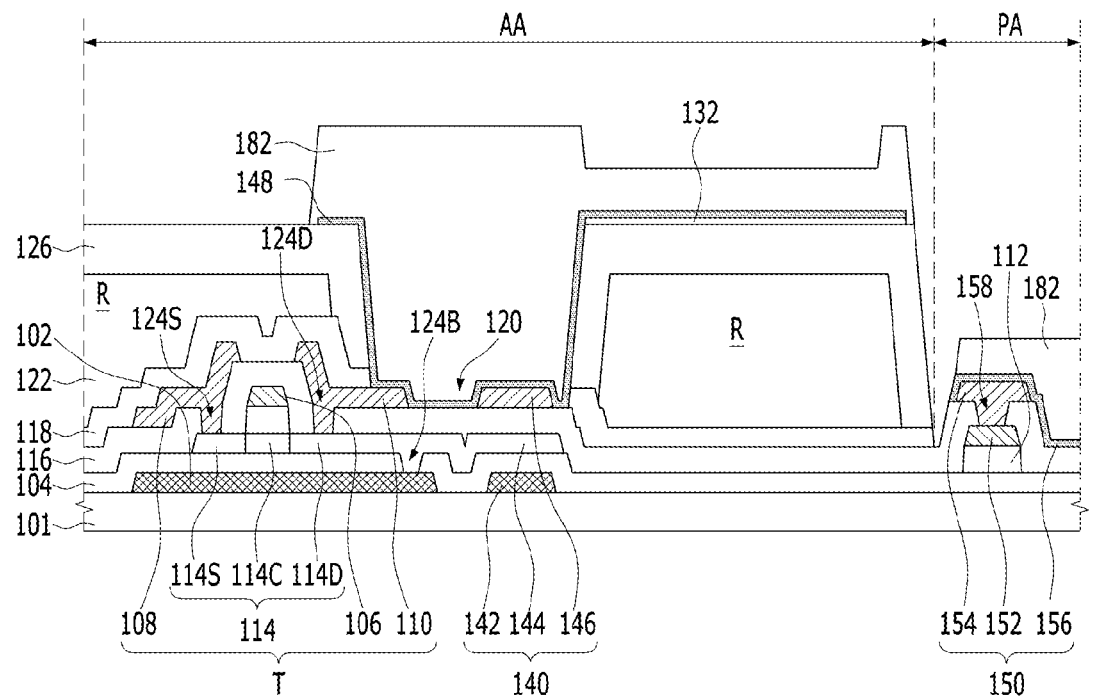
Figure 6C:
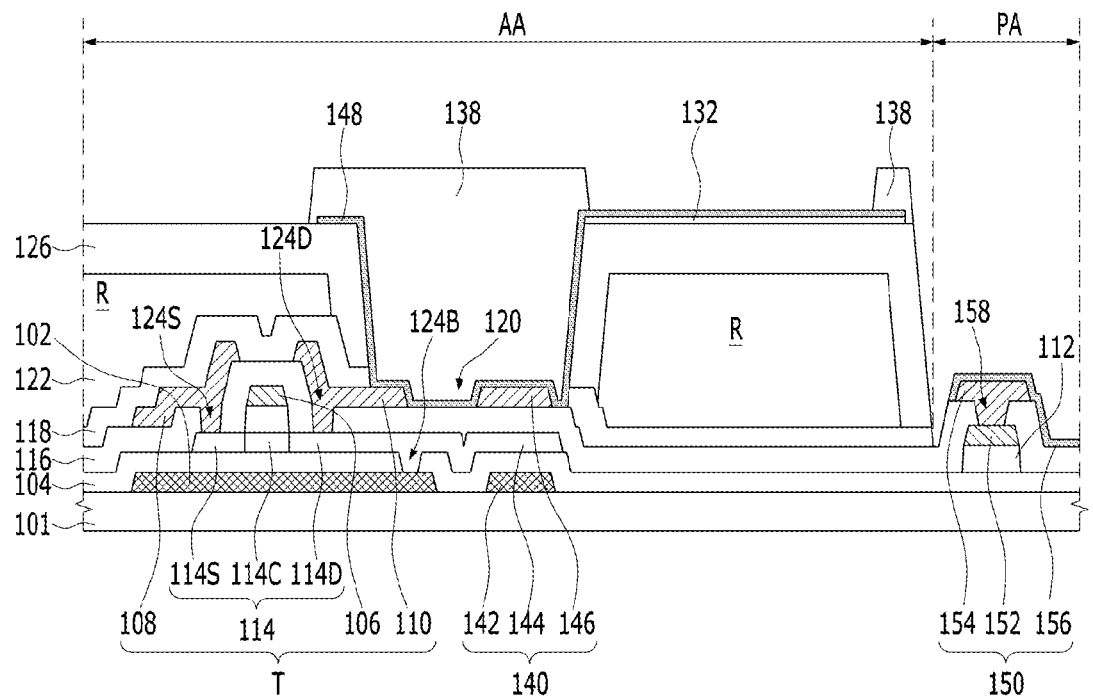

Specifically, as illustrated in FIG. 6A, the second transparent conductive layer 180 is deposited via, for example, sputtering on the entire surface of the substrate 101 having the planarization layer 126 and the anode electrode 132 formed thereon. Next, the bank photosensitive pattern 182 having a multistep structure is formed by applying a bank photosensitive layer to the entire surface of the second transparent conductive layer 180 and then exposing and developing the bank photosensitive layer using a halftone mask or a slit mask. The bank photosensitive pattern 182 is formed into a first thickness on the area in which the bank photosensitive pattern overlaps the emission area and the second pad electrode 154, and is formed into a second thickness along the edge of the sub-pixel. The pad cover electrode 156 and the pixel connection electrode 148 are formed, as illustrated in FIG. 6B, by wet etching the transparent conductive layer 180 using the bank photosensitive pattern 182 as a mask. Next, as illustrated in FIG. 6C, through the reflow of the bank photosensitive pattern 182 using a curing process, the bank photosensitive pattern 182 is formed to cover the side surface of the exposed anode electrode 132 and the pad cover electrode 156. Next, by ashing the bank photosensitive pattern 182, the bank photosensitive pattern 182 having the first thickness is removed so that the pad cover electrode 156 and the pixel connection electrode 148 on the emission area are exposed, and the bank photosensitive pattern 182 having the second thickness is reduced in thickness to thereby form the bank 138. Since the bank 138 is formed to cover the side surface of the anode electrode 132 and the side surface of the pixel connection electrode 148, for example, corrosion of the anode electrode 132 and the pixel connection electrode 148 may be prevented.

Figure 4J:
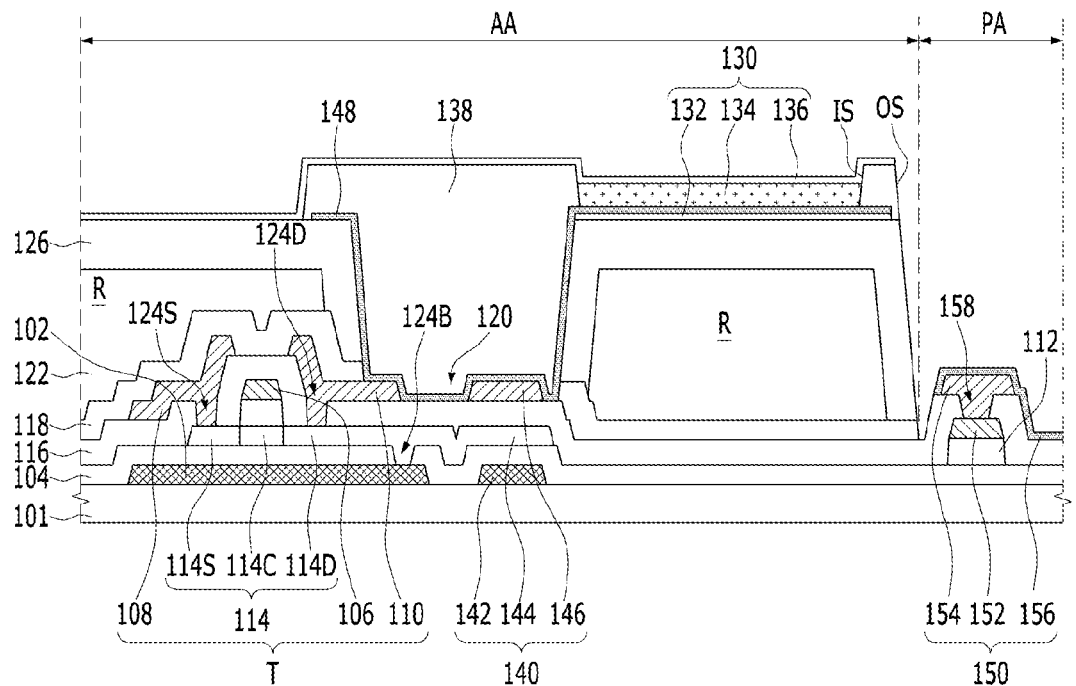

Referring to FIG. 4J, the organic light-emitting layer 134 and the cathode electrode 136 are sequentially formed on the substrate 101 having the anode electrode 132, the pad cover electrode 156, and the bank 138 formed thereon. The organic light-emitting layer 134 is formed on the emission area exposed by the bank 138, and the cathode electrode 136 is formed on the substrate 101 having the organic light-emitting layer 134 formed thereon.

As described above, in the present disclosure, the anode electrode 132, the protective layer 118, and the planarization layer 126 are formed via the same single mask process, and the pixel connection electrode 148, the pad cover electrode 156, and the bank 138 are formed via the same single mask process. Thereby, the present disclosure may reduce the total number of mask processes by at least one mask as compared to masks used in the related art, which may increase productivity and reduce costs.

Meanwhile, although an example in which the process of secondarily etching the first transparent conductive layer 170 and the process of etching the second transparent conductive layer 180 are individually performed has been described in the present disclosure, as illustrated in FIGS. 7A to 7E, the process of secondarily etching the first transparent conductive layer 170 and the process of etching the second transparent conductive layer 180 may be performed at the same time. In this case, since the anode photosensitive pattern 172 has a consistent thickness, the etching process may be minimized and the ashing process may be unnecessary, which simplifies processing.

Figure 7A:
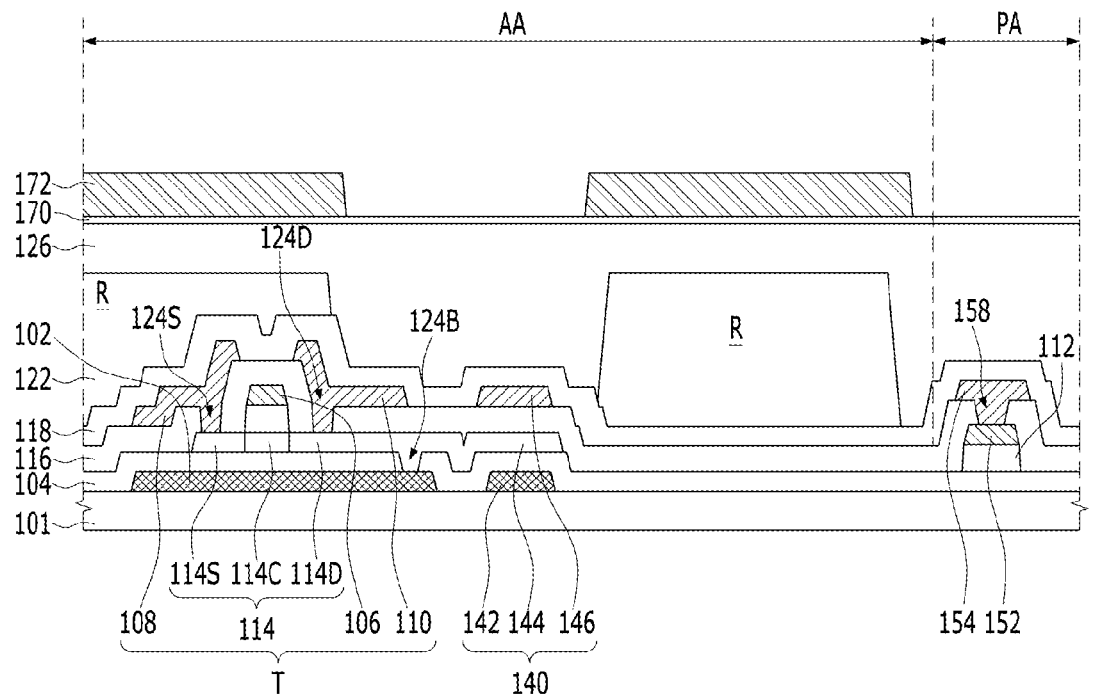
FIGS. 7A to 7E are cross-sectional views for explaining another embodiment of the method of manufacturing the pixel contact hole, the planarization layer, and the anode electrode illustrated in FIGS. 5A to 5C and the method of manufacturing the bank, the pixel connection electrode, and the pad cover electrode illustrated in FIGS. 6A to 6C in detail.
Figure 7B:
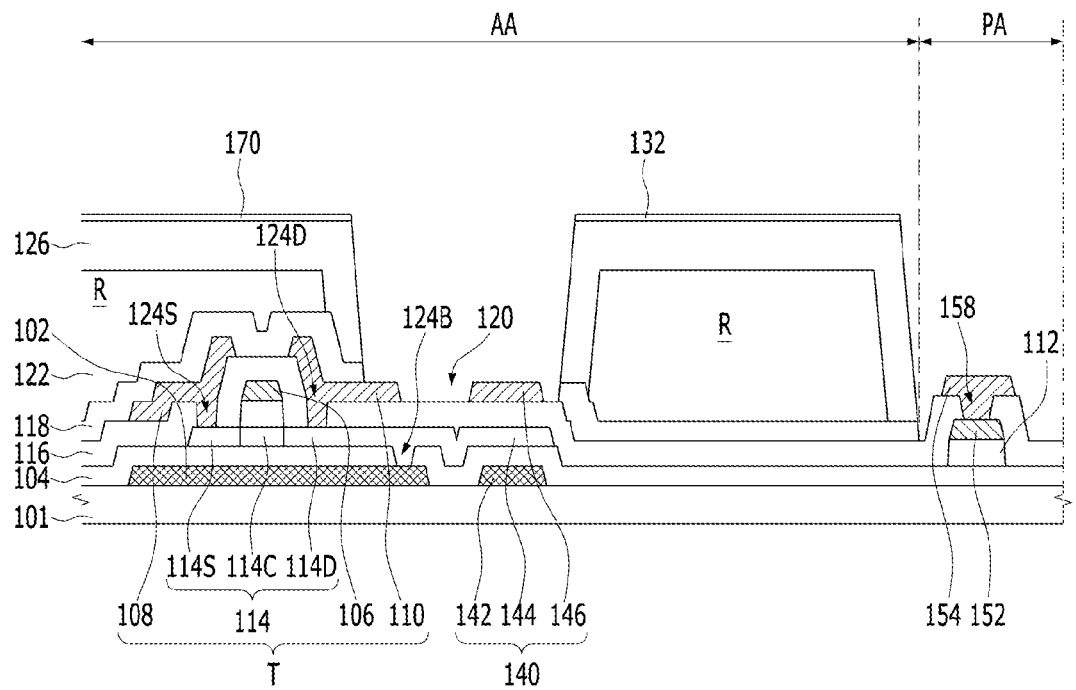
Figure 7C:
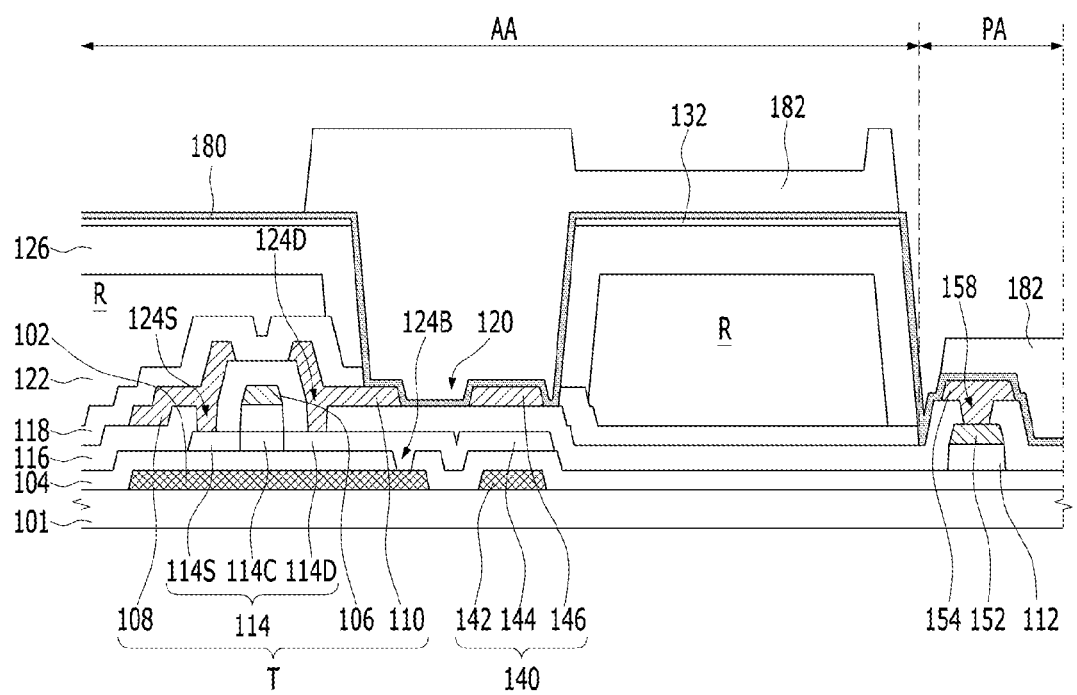
Figure 7D:
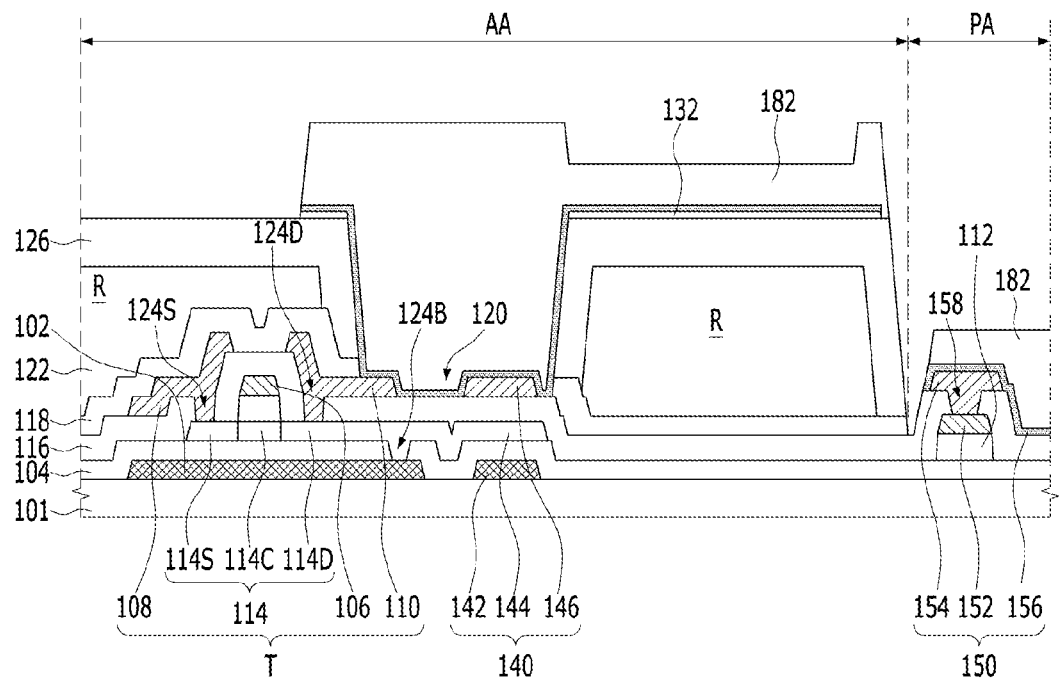
Figure 7E:
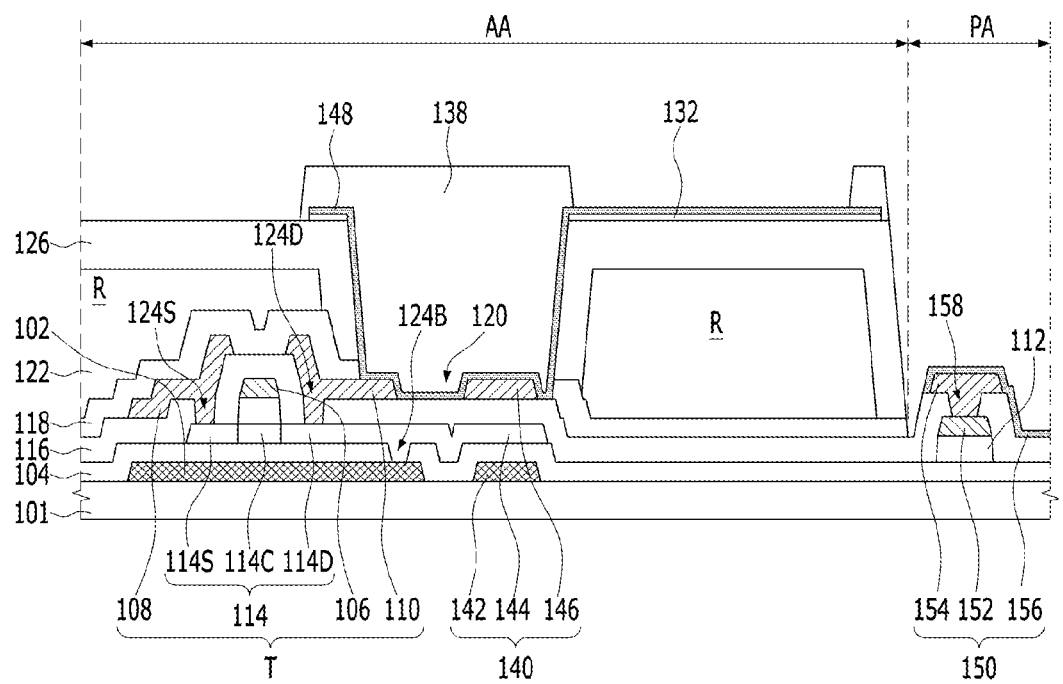

Specifically, as illustrated in FIG. 7A, the planarization layer 126 formed of an acryl resin and the first transparent conductive layer 170 are sequentially stacked one above another on the substrate 101 having the color filters 122 formed thereon. Next, the anode photosensitive pattern 172 is formed by applying an anode photosensitive layer to the entire surface of the first transparent conductive layer 170 and then patterning the photosensitive layer. The anode photosensitive pattern 172 has the same thickness in both the areas in which it overlaps the thin film transistor T and the emission area respectively. The anode electrode 132 is formed on the emission area and the first transparent conductive layer 170 remains on the area in which the first transparent conductive layer overlaps the thin film transistor, as illustrated in FIG. 7B, by primarily wet etching the first transparent conductive layer 170 using the anode photosensitive pattern 172 as a mask. Next, the pixel contact hole 120 is formed, and simultaneously, the second pad electrode 154 is exposed by dry etching the planarization layer 126 and the protective layer 118 using the anode photosensitive pattern 172 as a mask. Next, as illustrated in FIG. 7C, the second transparent conductive layer 180 is deposited on the entire surface of the substrate 101 having the planarization layer 126 and the anode electrode 132 formed thereon. Next, as illustrated in FIG. 7D, the bank photosensitive pattern 182 having a multistep structure is formed on the second transparent conductive layer 180. The pad cover 156 and the pixel connection electrode 148 are formed by wet etching the second transparent conductive layer 180 using the bank photosensitive pattern 182 as a mask, and simultaneously, the first transparent conductive layer 170 remaining on the thin film transistor area is removed by secondarily wet etching the first transparent conductive layer 170. Next, by ashing the bank photosensitive pattern 182, as illustrated in FIG. 7E, the bank photosensitive pattern 182 having the first thickness is removed so that the pad cover electrode 156 and the pixel connection electrode 148 are exposed, and the bank photosensitive pattern 182 having a second thickness is reduced in thickness to thereby form the bank 138.

Figure 8:
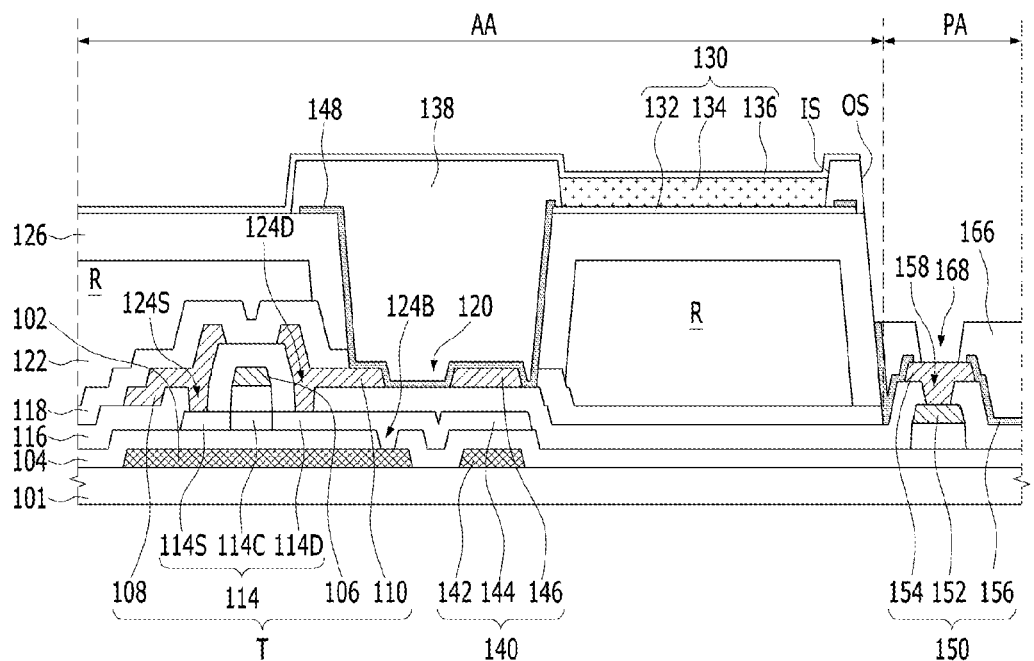
FIG. 8 is a cross-sectional view illustrating an organic light-emitting display device according to a second embodiment of the present disclosure.

FIG. 8 is a cross-sectional view illustrating an organic light-emitting display device according to a second embodiment of the present disclosure.

The organic light-emitting display device illustrated in FIG. 8 includes the same constituent elements as the organic light-emitting display device illustrated in FIG. 2 except that the pad cover electrode 156 is formed to expose the second pad electrode 154 and the pixel connection electrode 148 is formed to expose the anode electrode 132. Thus, a detailed description related to the same constituent elements will be omitted.

The pixel connection electrode 148 is formed of an opaque conductive layer having strong corrosion resistance and acid resistance, unlike the anode electrode 132 formed of a transparent conductive layer. For example, the pixel connection electrode 148 is formed of MoTi. Since the pixel connection electrode 148 has a line width similar to that of the bank 138 in the area in which it overlaps the bank 138, the pixel connection electrode 148 is formed to expose the anode electrode 132 formed of the transparent conductive layer in the emission area.

The second pad electrode 154 has a multilayered structure and the uppermost layer of the second pad electrode 154 is formed of a transparent conductive layer. That is, the second pad electrode 154 includes an opaque conductive layer and a transparent conductive layer stacked on the opaque conductive layer. The opaque conductive layer is formed in a single layer or in multiple layers using a metal such as Mo, Ti, Al, Cu, Co, W, Ta or Ti having good conductivity. The transparent conductive layer is formed of, for example, ITO, IZO or ITZO, which has strong corrosion resistance and acid resistance. For example, the second pad electrode may have a stacked structure of Cu and ITO in this sequence, or a stacked structure of MoTi, Cu and ITO in this sequence. Here, MoTi serves to increase the adhesive strength between the interlayer insulation layer 116 and Cu.

Meanwhile, the source electrode 108, the drain electrode 110, and the storage upper electrode 146, which are formed via the same mask process as the second pad electrode 154, have a multilayered structure, in the same manner as the second pad electrode 154.

The pad cover electrode 156 is formed of the same material as the pixel connection electrode 148, i.e., MoTi. The pad cover electrode 156 comes into contact with the upper surface and the side surface of the second pad electrode 154, and is formed in the same pattern as the pad protective layer 166, which is formed of the same material as the bank 138 at the same time as the formation of the bank 138. In this case, the uppermost transparent conductive layer of the second pad electrode 154, i.e., the transparent conductive layer is exposed through the second pad contact hole 158, which penetrates the pad cover electrode 156 and the pad protective layer 166. Here, since the pad protective layer 166 is thinner than the planarization layer 126, the height difference caused by the second pad contact hole 168 may be reduced, which may prevent contact failure between the second pad electrode 154 and a conductive ball. In addition, in the display device according to the present disclosure, the anode electrode 132, the protective layer 118, and the planarization layer 126 are formed via the same single mask process, and the pixel connection electrode 148, the pad cover electrode 156, the pad protective layer 166, and the bank 138 are formed via the same single mask process. Thereby, the present disclosure may reduce the total number of mask processes by one compared to the related art, which may increase productivity and reduce costs.

As described above, the method of manufacturing the organic light-emitting display device illustrated in FIG. 8 is the same as the method of manufacturing the organic light-emitting display device illustrated in FIG. 3 excluding a method of forming the pixel connection electrode 148, the pad cover electrode 156, the pad protective layer 166, and the bank 138. Thus, the method of manufacturing the pixel connection electrode 148, the pad cover electrode 156, the pad protective layer 166, and the bank 138 will be described below with reference to FIGS. 9A and 9B.

Figure 9A:
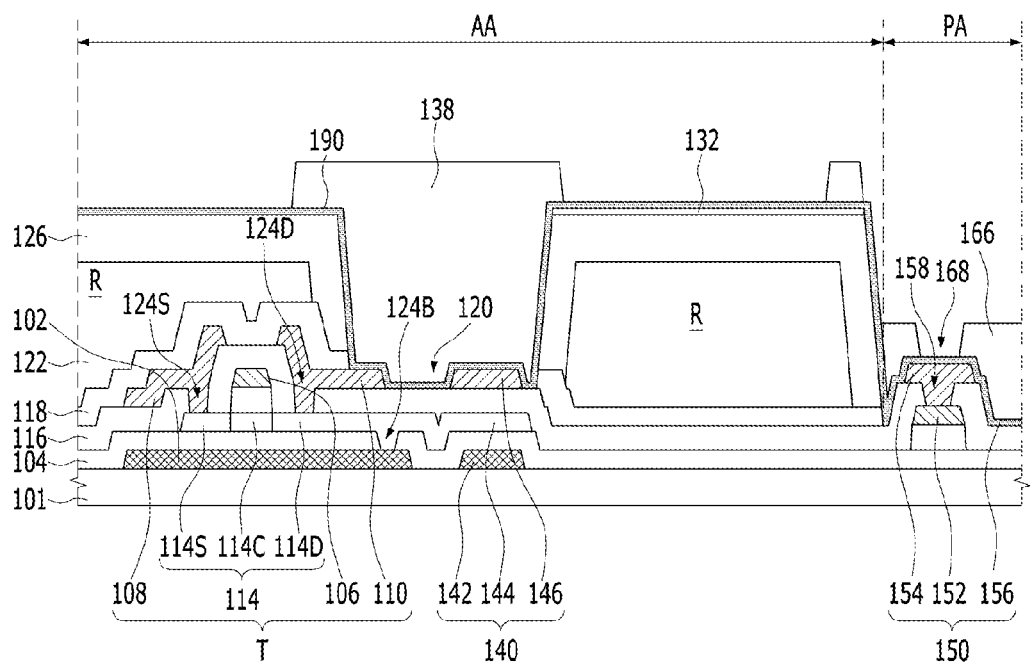
FIGS. 9A and 9B are cross-sectional views for explaining a method of manufacturing the organic light-emitting display device illustrated in FIG. 8.
Figure 9B:
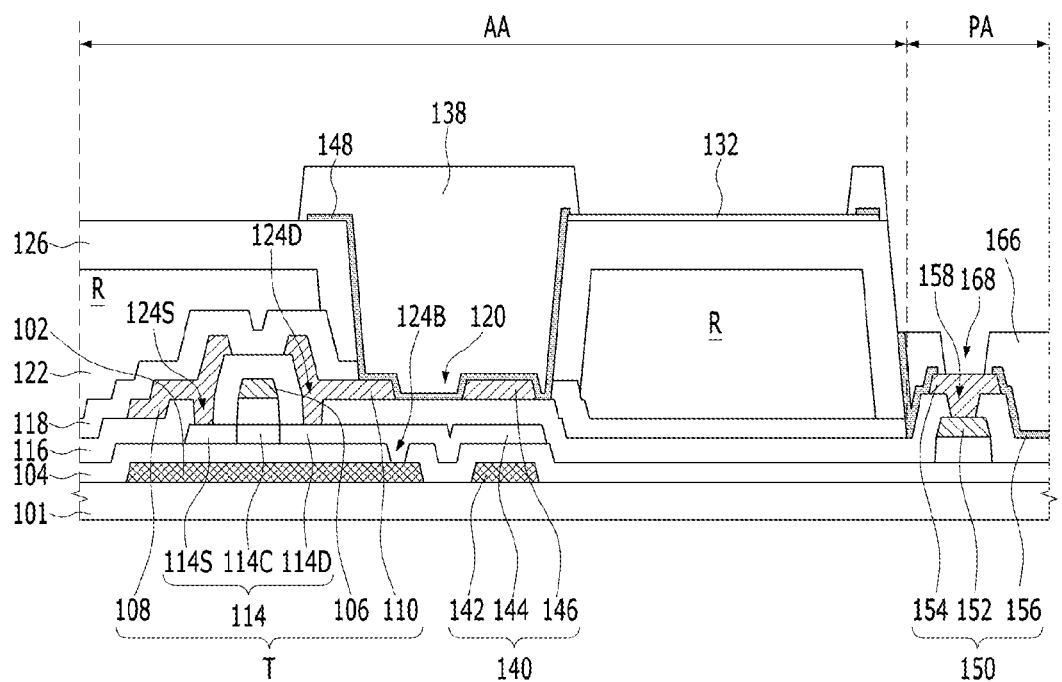

As illustrated in FIG. 9A, an opaque conductive layer 190 is deposited via, for example, sputtering on the entire surface of the substrate 101 having the planarization layer 126 and the anode electrode 132 formed thereon. Next, the bank 138 and the pad protective layer 166, which have the same thickness, are formed by applying a bank photosensitive layer to the entire surface of the transparent conductive layer 190 and then patterning the bank photosensitive layer via a photolithography process. The pad cover electrode 156 and the pixel connection electrode 148 are formed, as illustrated in FIG. 9B, by wet etching the opaque conductive layer 190 using the bank 138 and the pad protective layer 166 as a mask. At this time, the pad cover electrode 156 is formed to expose the second pad electrode 154, and the pixel connection electrode 148 is formed to expose the anode electrode 132.

As described above, in the present disclosure, the anode electrode 132, the protective layer 118, and the planarization layer 126 are formed via the same single mask process, and the pixel connection electrode 148, the pad cover electrode 156, the bank 138, and the pad protective layer 166 are formed via the same single mask process. Thereby, the present disclosure may reduce the total number of mask processes by at least one compared to masks used in the related art, which may increase productivity.

According to embodiments of the present disclosure, a planarization layer is disposed on an active area excluding a pad area. Thereby, in the present disclosure, a pad cover electrode disposed on the pad area comes into contact with an upper surface and a side surface of a pad electrode, which may prevent contact failure between the pad cover electrode and a conductive ball. In addition, in a display device according to the present disclosure, a first electrode, which is connected to a thin film transistor via a pixel connection electrode, is formed via the same mask process as the planarization layer to overlap the planarization layer on the area in which the first electrode corresponds to the planarization layer, which may simplify a structure and a manufacturing process.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure. Accordingly, various embodiments disclosed in the present disclosure are not intended to limit the technical sprit of the present disclosure, and the scope of the technical sprit of the present disclosure should be interpreted based on the following claims, and all technical ideas that fall within the range equivalent to the claims should be understood as belonging to the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a substrate having an active area and a pad area;
a thin film transistor disposed on the active area of the substrate;
a first electrode electrically connected to the thin film transistor in the active area;
a planarization layer disposed on the active area, but not on the pad area; and
a pixel connection electrode in contact with the thin film transistor in a pixel contact hole that penetrates through the planarization layer, the pixel connection electrode in direct contact with the first electrode in the active area; and
a bank on the pixel connection electrode, at least a portion of the bank positioned in the pixel contact hole.

2. The display device according to claim 1, further comprising:

a protective layer between the substrate and the planarization layer;
a light-emitting layer disposed on the first electrode;
a second electrode disposed on the light-emitting layer;
a pad electrode disposed on the pad area of the substrate; and
a pad cover electrode in direct contact with an upper surface and a side surface of the pad electrode,
wherein the planarization layer overlaps the first electrode in an area in which the planarization layer corresponds to the first electrode.

3. A display device comprising:
a substrate having an active area and a pad area;
a thin film transistor disposed on the active area of the substrate;
a first electrode electrically connected to the thin film transistor in the active area;
a planarization layer disposed on the active area, but not on the pad area; and
a pixel connection electrode in contact with the thin film transistor through a pixel contact hole penetrating the planarization layer and directly in contact with the first electrode in the active area,
wherein the pixel connection electrode is disposed to cover the first electrode, and
wherein the pixel connection electrode is formed of a same transparent conductive material as the first electrode.

4. The display device according to claim 2, wherein the pad cover electrode is disposed to cover the upper surface and the side surface of the pad electrode.

5. A display device comprising:
a substrate having an active area and a pad area;
a thin film transistor disposed on the active area of the substrate;
a first electrode electrically connected to the thin film transistor in the active area;
a planarization layer disposed on the active area, but not on the pad area; and
a pixel connection electrode in contact with film transistor through a pixel contact hole penetrating the planarization layer and directly in contact with the first electrode in the active area,
wherein the pixel connection electrode is disposed to expose the first electrode,
wherein the pixel connection electrode is formed of an opaque conductive layer, and
wherein the first electrode is formed of a transparent conductive layer.

6. The display device according to claim 5, further comprising:
a pad electrode disposed on the pad area of the substrate;
a pad cover electrode on the pad electrode;
a pad protective layer disposed on the pad cover electrode; and
a pad contact hole penetrating the pad protective layer and the pad cover electrode to expose a portion of an upper surface of the pad electrode.

7. The display device according to claim 6, further comprising a bank disposed on the first electrode in an area in which the bank overlaps the pixel connection electrode, the bank being formed of a same material as the pad protective layer.

8. The display device according to claim 2, wherein the pad electrode includes:
a first pad electrode formed of a same material as a gate electrode of the thin film transistor; and a second pad electrode formed of a same material as a drain electrode of the thin film transistor.

9. The display device according to claim 1, further comprising a color filter disposed in an area in which the color filter corresponds to the first electrode and the thin film transistor,
wherein the color filter corresponding to the thin film transistor is formed in a single layer or in multiple layers.

10. A method of manufacturing a display device comprising:
forming a thin film transistor that is disposed on an active area of a substrate;
forming a first electrode that is electrically connected to the thin film transistor, and, forming a planarization layer that is disposed underneath the first electrode on the active area; and
forming a pixel connection electrode that comes into contact with the thin film transistor through a pixel contact hole penetrating the planarization layer and directly comes into contact with the first electrode, and forming a bank on the pixel connection electrode, at least a portion of the bank positioned in the pixel contact hole.

11. The method according to claim 10, further comprising:
forming a pad electrode on the pad area of the substrate;
forming, using a first mask, a protective layer underneath the planarization layer, the planarization layer and the first electrode;
forming a light-emitting layer disposed on the first electrode;
forming, using a second mask, on the first electrode, the bank that defines an emission area of the light-emitting layer, a pad cover electrode that comes into contact with an upper surface and a side surface of the pad electrode, and the pixel connection electrode; and
forming a second electrode on the light-emitting layer,
wherein the planarization layer overlaps the first electrode in an area in which the planarization layer corresponds to the first electrode.

12. The method according to claim 11, wherein the forming the protective layer, the planarization layer and the first electrode includes:
forming a protective layer material, a planarization material, and a first conductive layer over an entire surface of the substrate having the thin film transistor and the pad electrode formed thereon, the first conductive layer being a first transparent conductive layer;
forming the first mask by forming a photosensitive layer pattern having a multistep structure on the first transparent conductive layer;
forming the first electrode by etching the first transparent conductive layer, using the photosensitive layer pattern as the first mask, and exposing the upper surface and the side surface of the pad electrode by etching the protective layer material and the planarization material, the etching the planarization material including etching the planarization material from the pad area; and
removing the first transparent conductive layer remaining on the planarization layer that overlaps the thin film transistor.

13. The method according to claim 11, wherein the forming the bank, the pixel connection electrode, and the pad cover electrode includes:

forming a second transparent conductive layer on the substrate having the protective layer, the planarization layer and the first electrode formed thereon;
forming the second mask by forming a photosensitive layer pattern having a multistep structure on the second transparent conductive layer;
forming the pixel connection electrode and the pad cover electrode by etching the second transparent conductive layer using the photosensitive layer pattern as the second mask; and
forming the bank by reducing a thickness of the photosensitive layer pattern, and exposing the pixel connection electrode and the pad cover electrode on the emission area.

14. The method according to claim 11, wherein the forming the bank, the pixel connection electrode and the pad cover electrode includes:
forming an opaque conductive layer on the substrate having the protective layer, the planarization layer, and the first electrode formed thereon;
forming the bank and a pad protective layer on the opaque conductive layer; and
forming the pixel connection electrode, which exposes the first electrode, and the pad cover electrode, which exposes the pad electrode, on the emission area by etching the opaque conductive layer using the bank and the pad protective layer as the second mask.

15. The method according to claim 13, wherein the forming the pad electrode includes:
forming a first pad electrode using a same material as a gate electrode of the thin film transistor; and
forming a second pad electrode using a same material as a drain electrode of the thin film transistor.

16. A display device comprising:
a substrate having an active area and a pad area spaced apart from the active area;
a thin film transistor disposed on the active area of the substrate;
a first electrode electrically connected to the thin film transistor in the active area;
a planarization layer disposed on the active area;
a pixel connection electrode in contact with the thin film transistor through a pixel contact hole penetrating the planarization layer;
a conductive pad comprised of multiple layers and disposed in the pad area;
a protective layer underneath the planarization layer, and the first electrode;
a light-emitting layer disposed on the first electrode;
a bank that defines an emission area of the light-emitting layer, and
wherein at least one of the pixel connection electrode and the conductive pad includes an opaque conductive material.

17. The display device of claim 16 wherein the conductive pad includes:
a pad electrode disposed on the pad area of the substrate; and
a pad cover electrode in direct contact with an upper surface and a side surface of the pad electrode.

18. The display device of claim 3, further comprising:
a protective layer between the substrate and the planarization layer;
a light-emitting layer disposed on the first electrode;
a second electrode disposed on the light-emitting layer;
a pad electrode disposed on the pad area of the substrate; and a pad cover electrode in direct contact with an upper surface and a side surface of the pad electrode,
wherein the planarization layer overlaps the first electrode in an area in which the planarization layer corresponds to the first electrode.

\* \* \* \* \*